United States Patent
Kim et al.

[11] Patent Number: 5,962,888
[45] Date of Patent: Oct. 5, 1999

[54] WELL STRUCTURE NON-VOLATILE MEMORY DEVICE AND METHOD FOR FABRICATING THE SAME

[75] Inventors: Jhang-Rae Kim; Dong-Soo Jang, both of Kyonggi-do, Rep. of Korea

[73] Assignee: Samsung Electronics Co. Ltd., Suwon, Rep. of Korea

[21] Appl. No.: 09/190,013

[22] Filed: Nov. 12, 1998

[30] Foreign Application Priority Data

Dec. 29, 1997 [KR] Rep. of Korea ................. 97-76000

[51] Int. Cl.$^6$ .................. H01L 29/76; H01L 29/788; H01L 23/62
[52] U.S. Cl. .................. 257/315; 257/314; 257/316; 257/319; 257/355
[58] Field of Search .................. 257/314, 315, 257/316, 317, 319, 356, 371, 355

[56] References Cited

PUBLICATIONS

Tomoharu Tanaka et al. "A 4–Mbit NAND–EEPROM with Tight Programmed Vt Distribution", 1990 Symposium on VLSI Circuits, Digest of Technical Papers, pp. 105–106.

Kang–Deog Suh et al.; "A 3.3 V 32 Mb NAND Flash Memory with Incremental Step Pulse Programming Scheme" IEEE Journel of Solid–State Circuits, vol. 30, No. 11, Nov. 1995; pp. 1149–1156.

John Yuan–Tai Chen; "Quadruple–Well CMOS for VLSI Technology" IEEE Transactions on Electron Devices, vol. ED–31, No. 7, Jul. 1984; pp. 910–919.

*Primary Examiner*—Valencia Martin-Wallace
*Assistant Examiner*—Jesse A. Fenty
*Attorney, Agent, or Firm*—Jones Volentine, L.L.P.

[57] ABSTRACT

In a semiconductor memory device, a plurality of first and second impurity regions of a second conductivity type are provided as wells in a semiconductor substrate of a first conductivity type. Outside of the first and second impurity regions, a plurality of third impurity regions of the first conductivity type are provided as wells in the substrate. A plurality of fourth impurity regions of the first conductivity type are provided as wells in the plurality of first impurity regions of the second conductivity type. The first impurity regions of the second conductivity type each have an impurity concentration which gradually decrease with increasing depth below the top surface of the semiconductor substrate, and the fourth impurity regions of the first conductivity type have at least two impurity concentration peaks below the top surface of the semiconductor substrate. A memory cell can be reliably erased by forming a retrograde pocket well for a memory cell array, and a diffusion well surrounding the pocket well, thus maintaining a high breakdown voltage between the pocket well and the substrate.

12 Claims, 4 Drawing Sheets

5,962,888

WELL STRUCTURE NON-VOLATILE MEMORY DEVICE AND METHOD FOR FABRICATING THE SAME

BACKGROUND OF THE INVENTION

1. Field of the Invention

The present invention relates to a semiconductor memory device, and in particular, to a well structure in a NAND-type flash EEPROM (Electrically Erasable and Programmable Read Only Memory) device having a plurality of memory cell transistors for storing data and select transistors for selecting the memory cell transistors, and a method for fabricating the same.

2. Description of the Related Art

Semiconductor memory devices are largely divided into RAMs (Random Access Memories), such as DRAMs (Dynamic RAMs) and SRAMs (Static RAMs), and ROMs (Read Only Memories). RAMs, also referred to as volatile memories because the stored data is destroyed with the passage of time, allow rapid data storage and data retrieval. ROMS, also referred to as nonvolatile memories because they retain data once it is entered, typically have slower data storage and data retrieval times.

Among ROMs, demands are increasing for EEPROMs, in which data is electrically programmed and erased. A flash EEPROM, which is electrically erasable at high speed without being removed from a circuit board, offers the advantages of a simple memory cell structure, cheap cost, and no need for a refresh signal to retain data.

Flash EEPROM cells are largely divided into two types: a NOR type EEPROM and a NAND type EEPROM. A NOR type EEPROM requires one contact in every two cells, which is not favourable for high scale integration, but has a large cell current, and is therefore capable of high-speed operation. A NAND type EEPROM is typically not capable of such high-speed operation due to a small cell current, but it shares one contact in a plurality of cells and thus is useful in realizing high scale integration. Therefore, the NAND flash EEPROM has attracted interest as a next generation memory device for use in digital still cameras and similar devices.

FIG. 1 is a sectional view of a cell array structure in a conventional NAND flash EEPROM, and FIG. 2 is an equivalent circuit diagram of the cell array (see, Symposium on VLSI Circuits, 1990, pp. 105–106).

Referring to FIGS. 1 and 2, a single string is composed of a string select transistor SST for selecting a unit string, a ground select transistor GST for selecting the ground, and a plurality of memory cell transistors connected in series between the string select transistor SST and the ground select transistor GST. A bit line is connected to the drain of the string select transistor SST and a common source line CSL is connected to the source of the ground select transistor GST. One block is comprised of a plurality of strings connected in parallel to bit lines, and such blocks are symmetrically arranged with respect to a bit line contact.

A memory cell transistor includes a stack comprised of a floating gate 18, formed on a semiconductor substrate 10 with interposition of a tunnel oxide film 16, and a control gate 22, formed on the floating gate 18 with interposition of an interlayer dielectric layer 20. The floating gate 18 extends across an active region and across edge portions of the field regions at both sides of the active region, thus being isolated from a floating gate 18 in an adjacent cell. The control gate 22 is connected to that of an adjacent cell, forming a word line W/L.

A string select transistor requires no floating gate for storing data, and thus its floating gate 18 and control gate 22 are connected by a metal wire through a butting contact on a field region in a cell array. Therefore, the string select transistors act as MOS transistors electrically having a single-layer gate structure.

A general NAND flash EEPROM cell array as constituted above is produced by forming an n-well 12 on a p-substrate 10 and then forming a p-well 14 (pocket p-well 14) inside the n-well 12. A description of the cell operation will hereinbelow be described.

For programming a selected cell, 0 V is applied to a bit line connected to the selected cell and a program voltage $V_{pgm}$ is applied to a word line connected to the selected cell, so that electrons are injected into the floating gate 18 due to the voltage difference between the channel and the control gate 22 of the memory cell transistor. Here, a pass voltage $V_{pass}$ is applied to unselected cells among a plurality of memory cells between the bit line and a ground node, to transfer data (i.e., 0 V) applied to the selected bit line to the selected cell.

For example, when $V_{pgm}$=20 V is applied to the word line of a selected cell A, $V_{pass}$=10 V is applied to the word lines for the unselected cells in the string and to the string select transistor SST, 0 V is applied to a selected bit line and a ground select transistor GST, and a program inhibit voltage $V_{pi}$=10 V is applied to an unselected bit line, then electrons are injected into the floating gate 18 through the tunnel oxide film 16 from the p-well 14 due to the $V_{pgm}$ of the selected cell A.

For erasing a cell, that is, removing electrons stored in the floating gate 18, an erase voltage $V_{erase}$=20 V is applied to the p-well 14, and 0 V is applied to a word line connected to the selected cell. Electrons are removed from the floating gate and holes are injected thereinto by an electrical field generated by $V_{erase}$ which has a reverse polarity to that applied during the programming operation. To prevent $V_{erase}$ applied to the p-well 14 during the erasing operation from affecting a peripheral circuit, the memory cell array is formed in the pocket p-well 14 in the n-well 12.

Data "0" or "1" is read from a selected cell according to the presence or absence of a current path through a selected cell, relying on the principle that the threshold voltage $V_{th}$ of the cell is changed to +1 V when electrons are stored in the cell, while the threshold voltage $V_{th}$ is changed to −3 V when holes are stored in the cell.

To inhibit an unselected cell B connected to the unselected bit line and the selected word line from being programmed in the above NAND flash EEPROM cell array, a voltage $V_{pi}$ =10 V applied to the unselected bit line is directly induced to the channel of the unselected cell B by $V_{pass}$ applied to the unselected word line, thereby reducing the $V_{pgm}$-induced electrical field and thus preventing F-N (Fowler-Nordheim) tunneling.

Because $V_{pi}$ is higher than the supply voltage $V_{cc}$ (3.3 V or 5 V), $V_{pi}$ should be produced by charge pumping using a capacitor. Charge pumping refers to generation of a required voltage by accumulating potential in a capacitor. As the required current capacity of the generated voltage increases, the capacitor requires a larger area. This increases the chip area required for forming the capacitor and increases the programming time, due to the time needed to charge the bit line voltage capacitor with $V_{pi}$. Both of these effects are undesirable.

Accordingly, to avoid application of a higher voltage than $V_{cc}$ to the unselected bit line, a method has been suggested in which $V_{cc}$ is applied to the unselected bit line and the string select transistor SST, $V_{pgm}$ is applied to the selected word line, $V_{pass}$ is applied to the unselected word lines, and 0 V is applied to the selected bit line, the well, and the ground select transistor GST, to thereby self-boost $V_{pi}$ to the channels of unselected strings (see, IEEE Journal of Solid State circuits, 1995, pp. 1149–1156).

According to the self-boosting scheme, the charge pump capacitor area needed to increase the bit line voltage can be reduced and charging time of the bit line voltage also reduced by applying $V_{cc}$, set to a maximum voltage, to a bit line and only applying a voltage larger than $V_{cc}$ to a word line. As a result, chip performance can be enhanced.

A description of a method of self-boosting a channel voltage to inhibit programming of a string cell will be given as follows.

Assuming that a floating gate is set to a neutral state, an average channel voltage (about 7 V) in a cell of an unselected bit line is calculated by $$V_{ch.avg} = \frac{(V_{ch.sel} + V_{ch.unsel} \times 15)}{16} + V_{prechg} \quad (1)$$

where $V_{ch.sel}$ is a channel voltage of an unselected cell connected to a selected word line, obtained by $$V_{ch.sel} = \frac{C_{ins}}{(C_{ins} + C_{ch})} \times V_{pgm} \quad (2)$$

In addition, the channel voltage $V_{ch.unsel}$ of an unselected cell connected to an unselected word line is expressed as $$V_{ch.unsel} = \frac{C_{ins}}{(C_{ins} + C_{ch})} \times V_{pass} \quad (3)$$

where $C_{ch}$ is a depletion capacitance generated by a depletion region formed under the channel, and $C_{ins}$ is a total capacitance between the control gate and the channel, defined as:

$$C_{ins} = \frac{C_{tun} \times C_{ono}}{C_{tun} + C_{ono}} \quad (4)$$

$V_{prechg}$, being about 1.5 V when $V_{cc}$ is 3.3 V, is precharged to the channel from the bit line before the programming operation is initiated, and is defined by:

$$V_{prechg} = V_{cc} - V_{th}' \quad (5)$$

where $V_{th}'$ is the threshold voltage of an string select transistor SST when a back bias is $V_{cc}$.

As can be seen from equation (5), as $V_{th}'$ increases, that is, as the body effect of the string select transistor SST becomes greater, $V_{prechg}$ precharged in the cell becomes smaller. Thus, a larger disturbance is imposed on the unselected cell, decreasing reliability. In addition, because the channel width of the string select transistor SST gets smaller in a higher-integration device, a narrow width effect causes the threshold voltage to increase, in turn increasing the body effect.

A method for reducing this narrow width effect is disclosed in U.S. Pat. No. 4,633,289 and No. 5,428,239.

According to U.S. Pat. No. 4,633,289, latch-up is suppressed by forming a retrograde well and thus reducing substrate resistance. Thus, the narrow width effect of a transistor is decreased, reducing the body effect and increasing the effective channel width. As a result, the current driving capability can be substantially increased. Furthermore, $C_{ch}$ is reduced by reducing the junction capacitance in a cell, so that $V_{ch.sel}$ and $V_{ch.unsel}$ are increased, in turn increasing $V_{ch.avg}$, and as a result, boosting efficiency is increased. Therefore, stresses caused by $V_{pgm}$ and $V_{pass}$ on unselected cells become smaller, enabling a cell of high reliability to be obtained.

According to this technique, the retrograde well is formed by high-energy ion-implantation, causing an impurity concentration peak to be observed at a predetermined depth of the substrate, such that the impurity concentration decreases nearer to the surface of the substrate. The formation of the retrograde well requires no high-temperature, long-time diffusion typically used for a diffusion well, thereby contributing to reduction of process cost, and reducing latch-up and soft error rate, thereby increasing device reliability.

According to U.S. Pat. No. 5,428,239, a retrograde well is formed in a memory cell array region, whereas a diffusion well is formed in a peripheral circuit region, to optimize characteristics of memory cells and peripheral circuit transistors.

A method of forming both a pocket p-well (or pocket n-well) and an n-well (or p-well) surrounding it as retrograde wells is described in IEEE Transactions on Electronic Devices, 1984, Vol. ED-37, No. 7, pp. 910–919. However, in this case, the electrical field is increased due to a high peak concentration, resulting in a decrease in the breakdown voltage between the pocket p-well and a p-substrate. As described above, because an erasing operation for a general NAND-type flash EEPROM cell is performed by applying an erase voltage $V_{erase}$=20 V to both the pocket p-well and the n-well, the breakdown voltage between the pocket p-well and the p-substrate should be higher than $V_{erase}$.

SUMMARY OF THE INVENTION

Therefore, an object of the present invention is to provide a semiconductor memory device which has a high well-to-well breakdown voltage to perform a reliable erasing operation on a memory cell, and to increase the reliability of the memory cell by reducing the body effect of a string select transistor.

Another object of the present invention is to provide a suitable method of fabricating the above semiconductor memory device. Other and further objects and advantages will be appear hereinafter.

In one aspect, the present invention comprises a semiconductor memory device formed in a semiconductor substrate. The semiconductor memory device includes a plurality of first and second impurity regions, provided as wells of a second conductivity type formed on a top surface of a semiconductor substrate of a first conductivity type. The device also includes a plurality of third impurity regions provided as wells of the first conductivity type, also formed on the top surface of the substrate in an area outside the plurality of first and second impurity regions. A plurality of fourth impurity regions are also provided as wells of the first conductivity type in the plurality of first impurity regions of the second conductivity type. The first impurity regions of the second conductivity type have an impurity concentration which gradually decreases with increasing distance from the surface of the semiconductor substrate, and the fourth impurity regions of the first conductivity type have at least two impurity concentration peaks at depths below the semiconductor surface. Preferably, the concentration peaks which are further from the top surface of the semiconductor substrate have a greater concentration than those closer to the surface.

In another aspect, the present invention provides a method of fabricating a semiconductor memory device having a memory cell array region and a peripheral circuit region for driving cells. In the method, a first well of a second conductivity type is formed by ion-implanting an impurity of the second conductivity type into the memory cell array region of a semiconductor substrate of a first conductivity type, to produce an impurity concentration in the first well which gradually decreases with increasing distance from the surface of the semiconductor substrate. Then, a second well of the first conductivity type is formed by ion-implanting an impurity of the first conductivity type at least twice in the first well of the second conductivity type, to produce at least two impurity concentration peaks in the second well at depths below the semiconductor surface.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
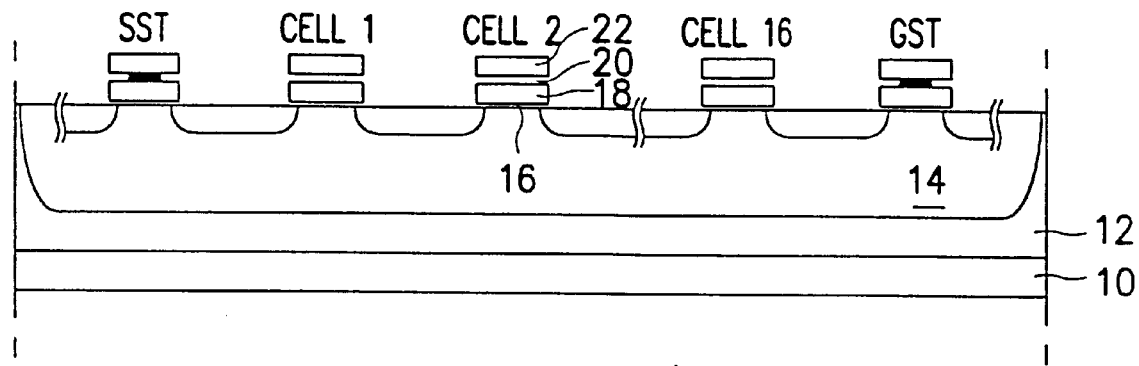
FIG. 1 is a sectional view of a cell array structure in a conventional NAND flash EEPROM device.
Figure 2:
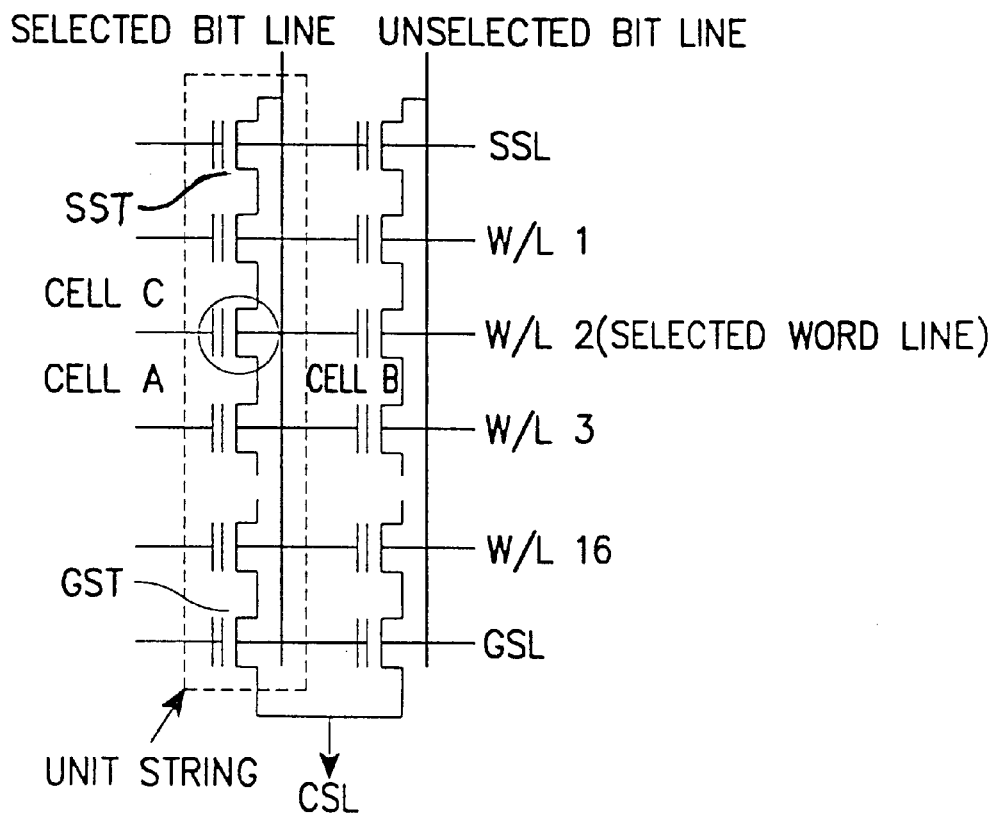
FIG. 2 is an equivalent circuit diagram of the cell array shown in FIG. 1.
Figure 3:
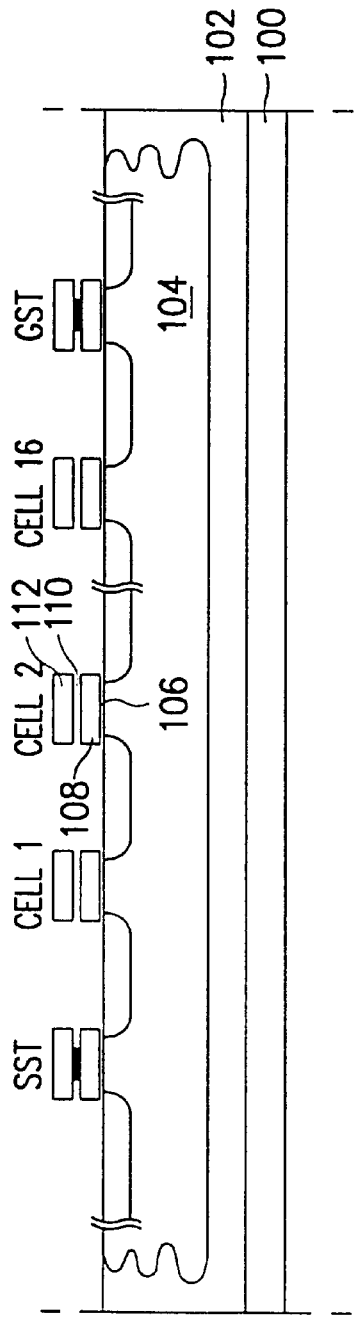
FIG. 3 is a sectional view of a cell array structure in a NAND flash EEPROM device according to the present invention.

FIG. 3 is a sectional view of a cell array structure in a NAND-type flash EEPROM device according one or more aspects of the present invention.

Referring to FIG. 3, a single string in the NAND-type flash EEPROM cell is composed of a string select transistor SST for selecting a unit string, a ground select transistor GST for selecting a ground, and a plurality of memory cell transistors between the string select transistor SST and the ground select transistor GST, each memory cell transistor having a stack comprising a floating gate 108 and a control gate 112. The drain of the string select transistor SST is coupled to a bit line, and the source of the ground select transistor GST is coupled to a common source line CSL. A plurality of such strings are connected in parallel to bit lines, forming one block, and such blocks are symmetrically arranged with respect to a bit line contact.

A memory cell transistor has a stack of the floating gate 108 formed over a p-semiconductor substrate 100 with interposition of a tunnel oxide film 106, and the control gate 112 formed over the floating gate 108 with interposition of an interlayer dielectric layer 110. The floating gate 108 extends across an active region and across edge portions of field regions at both sides of the active region, thus being isolated from a floating gate 108 in an adjacent cell. The control gate 112 is connected to a control gate 112 of an adjacent cell, forming a word line.

The floating gate 108 of the string select transistor SST is connected to the control gate 112 thereof by a metal wire through a butting contact on the field region in the cell array, because the string select transistor SST requires no floating gate for storing data. Therefore, the string select transistor SST acts electrically as a MOS transistor having a single-layer of gate structure.

The NAND-type flash EEPROM cell array as constituted above is formed in a pocket p-well 104 formed in an n-well 102. The pocket p-well 104 is a retrograde well formed by a plurality, "i", of high-energy ion-implantations. The pocket p-well 104 has a number, i, of p-type concentration peaks in the depth direction below the substrate surface, matching the number of ion implantations performed. The n-well 102 surrounding the pocket p-well 104 is a general diffusion well, and has an n-type concentration which gradually decreases with increasing distance from the top surface of the semiconductor substrate 100.

In a preferred embodiment, concentration peaks which are located further from the top surface of the semiconductor substrate have a greater impurity concentration than those peaks closer to the surface.

The foregoing structure, comprising a retrograde pocket p-well 104 for forming the memory cell array and a diffusion n-well 102 surrounding the pocket p-well 104, maintains a high breakdown voltage between the pocket p-well 104 and the p-substrate 100. Hence, despite application of a high voltage of 20 V or more to the pocket p-well 104 and the n-well 102 surrounding the pocket p-well 104 during erasing a memory cell, there is no operational problem.

In addition, because the narrow width effect of the string select transistor SST formed on the retrograde pocket p-well 104 is reduced, the reliability of the memory cell can be improved by reducing the body effect of the string select transistor SST and thereby increasing the precharge voltage. Furthermore, reduction of the narrow width effect leads to an increase in the current driving capability and a decrease in a junction capacitance, thereby increasing a boosting efficiency. As a result, a memory cell of high reliability can be obtained.

Figure 4:
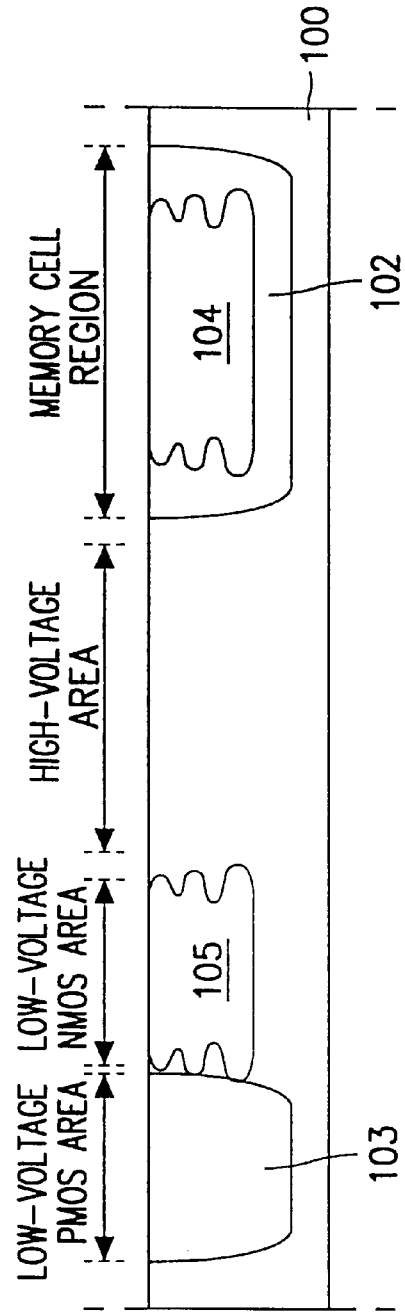
FIG. 4 is a sectional view of a NAND flash EEPROM device according to an embodiment of the present invention.

FIG. 4 is a sectional view of a NAND type flash EEPROM device according to an embodiment of the present invention, showing a memory cell array region and a peripheral circuit region. The peripheral circuit region is divided into a low-voltage PMOS transistor forming area, a low-voltage NMOS transistor forming area, and a high-voltage transistor forming area.

Referring to FIG. 4, the pocket p-well 104 for forming the memory cell array is a retrograde well, and the first n-well 102 surrounding the pocket p-well 104 is a diffusion well. In a preferred embodiment, concentration peaks which are located further from the top surface of the semiconductor substrate have a greater impurity concentration than those peaks closer to the surface.

In the peripheral circuit region, a second n-well 103 for forming a low-voltage PMOS transistor is a diffusion well, and a p-well 105 for forming a low-voltage NMOS transistor is a retrograde well. Alternatively, the second n-well 103 and the p-well 105 may be a retrograde well and a diffusion well, respectively.

FIGS. 5 to 8 are sectional views sequentially illustrating the steps of a method of fabricating a NAND flash EEPROM device according to the present invention.

Figure 5:
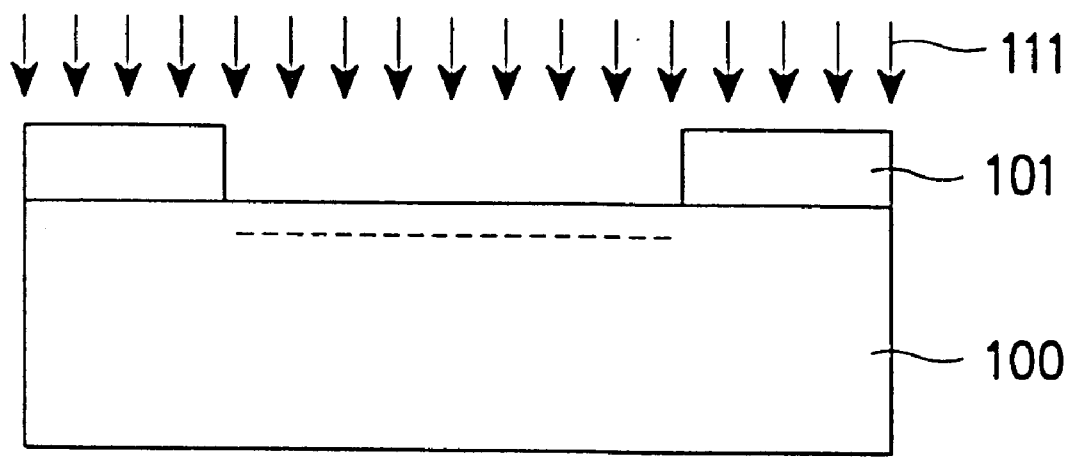
FIGS. 5 to 8 are sectional views sequentially illustrating a method of fabricating a NAND flash EEPROM device according to the present invention.

FIG. 5 shows the step of ion-implanting an n-type impurity 111. A first photoresist film pattern 101 is formed to define an n-well region by coating a first photoresist film on a p-semiconductor substrate 100 by photolithography, and exposing and developing the first photoresist film. Then the n-type impurity 111, for example phosphorous, is ion-implanted. In a preferred embodiment, the ion implantation is performed at an energy of 100 keV at a dose of $2.0 \times 10^{13}$ ions/cm$^2$, using the first photoresist film pattern 101 as an ion-implanting mask. Here, the n-type impurity 111 is ion-implanted simultaneously into a first n-well in a memory cell array region and a second n-well (e.g., a low-voltage PMOS transistor area) in a peripheral circuit region.

Figure 6:
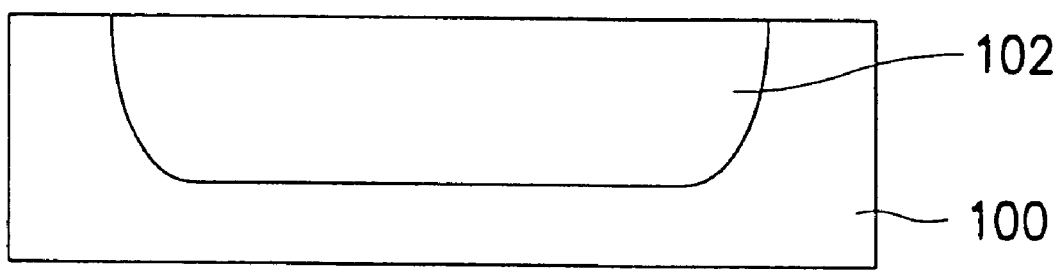

FIG. 6 shows the step of forming a first n-well 102. After the n-type impurity 111 is ion-implanted, the remaining first photoresist film pattern 101 is removed. Subsequently, the first n-well 102 and the second n-well (not shown) are simultaneously formed in the memory cell array region and the peripheral circuit region, respectively, by diffusing the ion-implanted n-type impurity 111. In a preferred embodiment, the diffusion is performed by a well drive-in process at 110° C. for eight hours. The impurity doping concentration of the first n-well 102 and the second n-well gradually decrease with increasing depth from the surface of the semiconductor substrate 100.

Here, to optimize characteristics of memory cells and peripheral circuit devices separately, the first n-well 102 of the cell array and the second n-well of the peripheral circuit region may be formed in different steps. That is, the second n-well can be formed before or after formation of the first n-well 102. It is preferable to form the first n-well 102 and the second n-well to be a diffusion n-well and a retrograde n-well, respectively.

Figure 7:
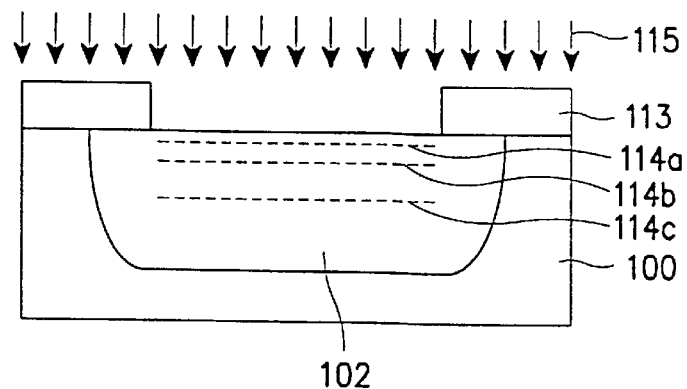
Figure 8:
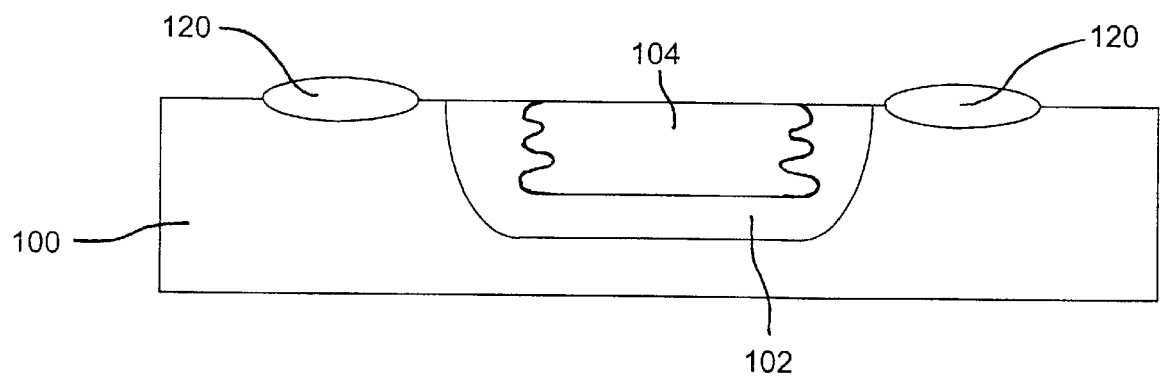

FIG. 7 shows the step of ion-implanting a p-type impurity 115. After the first n-well 102 and the second n-well are formed, a device isolation film 120 (see FIG. 8) is formed to define an active region and a field region on the substrate 100 by a general device isolation process. Then, a second photoresist film pattern 113 is formed to define a p-well region by coating a second photoresist film on the substrate 100 by photolithography, and exposing and developing the second photoresist film. Here, the second photoresist film pattern 113 simultaneously opens a first p-well in the memory cell array region and a second p-well (e.g., a low-voltage NMOS transistor area) in the peripheral circuit region.

Subsequently, the p-type impurity 115, for example, boron is ion-implanted a first time at a first energy and ion concentration level, and then a second time at a second energy and ion concentration level, using the second photoresist film pattern 113 as an ion-implanting mask. In a preferred embodiment, the first ion implantation is performed at an energy of 500 keV at a dose of 1.0E13 ions/cm$^2$, and the second ion implantation is performed at an energy of 250 keV at a dose of 1.0E13 ions/cm$^2$. Then, boron is ion-implanted again at a third energy and third ion concentration level. In a preferred embodiment, the third ion implantation is performed at an energy of 170 keV at a dose of 1.0E13 ions/cm$^2$. Thus, a first p-well 104 (i.e., a pocket p-well) and a second p-well (not shown) are formed (see FIG. 8) to have three boron concentration peaks 114a, 114b, and 114c in the depth direction of the substrate 100.

In a preferred embodiment, concentration peaks which are located further from the top surface of the semiconductor substrate have a greater impurity concentration than those peaks closer to the surface. For example, in a preferred embodiment, concentration peak 114c has a greater impurity concentration than concentration peak 114b which in turn has a greater impurity concentration than concentration peak 114a.

Here, to optimize characteristics of memory cells and peripheral circuit devices independently, the first p-well 104 of the memory cell array and the second p-well of the peripheral circuit region may be formed in different steps. That is, the second p-well may be formed before or after formation of the first p-well 104. Preferably, the first p-well 104 and the second p-well are a retrograde p-well and a diffusion p-well, respectively.

A device and method of fabrication as described above can produce the following benefits:

(1) By forming a retrograde well as a pocket well for a memory cell array, and a diffusion well as a well surrounding the pocket well, a high breakdown voltage between the pocket well and a substrate is maintained, thereby enabling a reliable erasing operation of a memory cell.

(2) By forming the pocket well as a retrograde well, the body effect of the string select transistor SST is reduced and thus the reliability of a memory cell is increased.

(3) Application of a retrograde well as the pocket well reduces the narrow width effect of a memory cell transistor, increasing a current driving capability.

(4) A highly reliable memory cell can be achieved by reducing the junction capacitance in the cell and thus increasing the boosting efficiency.

(5) Forming a retrograde well can also help reinforce immunity against latch-up.

Further, simulation has verified that the breakdown characteristics of a transistor fabricated according to the described embodiment is about ten times better than for a conventional transistor.

While the present invention has been described and illustrated with respect to the specific embodiments, they are mere exemplary applications. Thus, it is to be clearly understood that many variations can be made by anyone skilled in the art within the scope and spirit of the present invention.

What is claimed is:

1. A semiconductor memory device comprising:
a semiconductor substrate of a first conductivity type;
a plurality of first well portions of a second conductivity type formed in a top surface of said semiconductor substrate;
a plurality of second well portions of the second conductivity type formed in the top surface of said semiconductor substrate;
a plurality of third well portions of the first conductivity type formed in the top surface of the semiconductor substrate outside the plurality of first and second well portions; and
a plurality of fourth well portions of the first conductivity type formed in and adjacent to the top surface of the first well portions,
wherein the first well portions of the second conductivity type have an impurity concentration which gradually decreases with increasing depth below the top surface of the semiconductor substrate, and the fourth well portions of the first conductivity type have at least two impurity concentration peaks below the top surface of the semiconductor substrate.

2. The semiconductor memory device of claim 1, wherein said two impurity concentration peaks of each fourth well portion comprise a first impurity concentration peak and a second impurity concentration peak, where said first impurity concentration peak is located closer to the top surface of the semiconductor substrate and has a lower impurity concentration than said second impurity concentration peak.

3. The semiconductor memory device of claim 1, wherein the fourth well portions of the first conductivity type each have at least three impurity concentration peaks.

4. The semiconductor memory device of claim 3, wherein said three impurity concentration peaks of each fourth well portion comprise a first impurity concentration peak, a second impurity concentration peak, and a third impurity concentration peak, where said first impurity concentration peak is located closer to the top surface of the semiconductor substrate and has a lower impurity concentration than said second impurity concentration peak, and wherein said second impurity concentration peak is located closer to the top surface of the semiconductor substrate and has a lower impurity concentration than said third impurity concentration peak.

5. The semiconductor memory device of claim 1, wherein each of the plurality of second well portions of the second conductivity type have an impurity concentration which gradually decreases with increasing depth below the top surface of the semiconductor substrate.

6. The semiconductor memory device of claim 1, wherein each of the plurality of second well portions of the second conductivity type have at least two impurity concentration peaks below the top surface of the semiconductor substrate.

7. The semiconductor memory device of claim 6, wherein said two impurity concentration peaks of said each of said second well portions comprise a first impurity concentration peak and a second impurity concentration peak, where said first impurity concentration peak is located closer to the top surface of the semiconductor substrate and has a lower impurity concentration than said second impurity concentration peak.

8. The semiconductor memory device of claim 1, wherein each of the plurality of third well portions of the first conductivity type have at least two impurity concentration peaks below the top surface of the semiconductor substrate.

9. The semiconductor memory device of claim 8, wherein said two impurity concentration peaks of said each of said third well portions comprise a first impurity concentration peak and a second impurity concentration peak, where said first impurity concentration peak is located closer to the top surface of the semiconductor substrate and has a lower impurity concentration than said second impurity concentration peak.

10. The semiconductor memory device of claim 1, wherein the plurality of third well portions of the first conductivity type have an impurity concentration which gradually decreases with increasing depth below the top surface of the semiconductor substrate.

11. The semiconductor memory device of claim 1, wherein the first well portions are formed in a memory cell array region.

12. The semiconductor memory device of claim 1, wherein the second and third well portions are formed in a peripheral circuit region.

* * * * *